(12) United States Patent
Qu et al.

(10) Patent No.: US 11,598,307 B1
(45) Date of Patent: Mar. 7, 2023

(54) METHOD AND SYSTEM FOR IMPROVING FOULED SPARK PLUG DETECTION

(71) Applicant: Ford Global Technologies, LLC, Dearborn, MI (US)

(72) Inventors: Qiuping Qu, Troy, MI (US); Rani Kiwan, Canton, MI (US); Robert Sarow Baskins, Grass Lake, MI (US); Chris Paul Glugla, Macomb, MI (US); Imtiaz Ali, Lathrup Village, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 17/653,787

(22) Filed: Mar. 7, 2022

(51) Int. Cl.
*F02P 17/12* (2006.01)
*G01R 31/00* (2006.01)

(52) U.S. Cl.
CPC ............ *F02P 17/12* (2013.01); *G01R 31/007* (2013.01)

(58) Field of Classification Search
CPC ...................................................... F02P 17/12
USPC ................................. 123/436, 673; 73/114.04
See application file for complete search history.

(56) References Cited

U.S. PATENT DOCUMENTS

| | | | | |
|---|---|---|---|---|
| 5,144,927 A | * | 9/1992 | Denz ..................... | G01M 15/11 73/114.03 |
| 5,442,955 A | * | 8/1995 | Baba ..................... | G01M 15/11 340/439 |
| 5,921,221 A | * | 7/1999 | Davis, Jr. ............ | F02D 41/1498 123/436 |
| 7,900,509 B2 | | 3/2011 | Feldkamp et al. | |
| 8,099,998 B2 | | 1/2012 | Müller | |
| 8,925,531 B2 | | 1/2015 | Cunningham et al. | |
| 9,534,984 B2 | | 1/2017 | Glugla et al. | |
| 10,167,787 B1 | | 1/2019 | Glugla | |
| 2003/0167118 A1 | * | 9/2003 | Rizzoni ................ | F02D 35/024 73/114.04 |
| 2020/0294401 A1 | * | 9/2020 | Kerecsen ............. | G05D 1/0287 |
| 2020/0355134 A1 | * | 11/2020 | Kelly .................. | F02D 41/0085 |

* cited by examiner

*Primary Examiner* — Erick R Solis
(74) *Attorney, Agent, or Firm* — Vincent Mastrogiacomo; McCoy Russell LLP

(57) ABSTRACT

Methods and systems to determine a presence or absence of engine misfire or spark plug fouling are presented. In one example, rates of change in engine speed are arranged in engine data blocks and root mean square values for the rates of change in engine speed are determined. The presence or absence of engine misfire or spark plug fouling may be based at least in part on the root mean square values.

19 Claims, 6 Drawing Sheets

US 11,598,307 B1

METHOD AND SYSTEM FOR IMPROVING FOULED SPARK PLUG DETECTION

FIELD

The present application relates to methods and systems for detecting and overcoming spark plug fouling.

BACKGROUND/SUMMARY

An internal combustion engine may be cold started and operated for a very short period of time sometimes. For example, after a vehicle is manufactured, the vehicle may be moved from the assembly line to a transportation vehicle that is a short distance from the assembly line. Further, the vehicle may be moved from the transportation vehicle to a parking location that is close to the transportation vehicle. The engine of the vehicle may be cold started and then shut off shortly thereafter which may lead to spark plug fouling. The spark plug fouling may be related to starting the engine with a rich air-fuel mixture and then stopping the engine before carbonaceous soot formed by combusting the rich air-fuel mixture may be oxidized and removed. The spark plug fouling may cause the engine to run rough and engine emissions to degrade. Therefore, it may be desirable to determine if a spark plug has fouled so that the condition may be resolved.

The inventors herein have recognized that spark plug fouling may be undesirable. In addition, the inventors have developed a way for reliably detecting spark plug fouling, the method, comprising: generating a group of average values comprising an average value for each cylinder of the engine, the average value for each cylinder of the engine generated via averaging a group of consecutively generated root mean square values; generating a maximum value from the group of average values; and adjusting operation of the engine in response to the maximum value.

By generating a group of average values comprising an average value for each cylinder of an engine and adjusting operation of an engine in response to a maximum value that is from the group of average values, it may be possible to reduce a possibility of engine misfiring and spark plug fouling. In particular, an engine misfire or spark plug fouling metric may be generated from the average values and the spark plug fouling metric may provide improved performance over prior art methods of engine misfire determination.

The present approach may provide several advantages. In particular, the approach may be implemented via one of three methods, thereby improving system flexibility. The methods may be applied during different conditions to improve detection of engine misfires. Further, the approach may reduce a possibility of generating false indications of engine misfire and/or spark plug fouling. In addition, the approach may improve detection of engine misfire and/or spark plug fouling.

The above advantages and other advantages, and features of the present description will be readily apparent from the following Detailed Description when taken alone or in connection with the accompanying drawings.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

Figure 1:
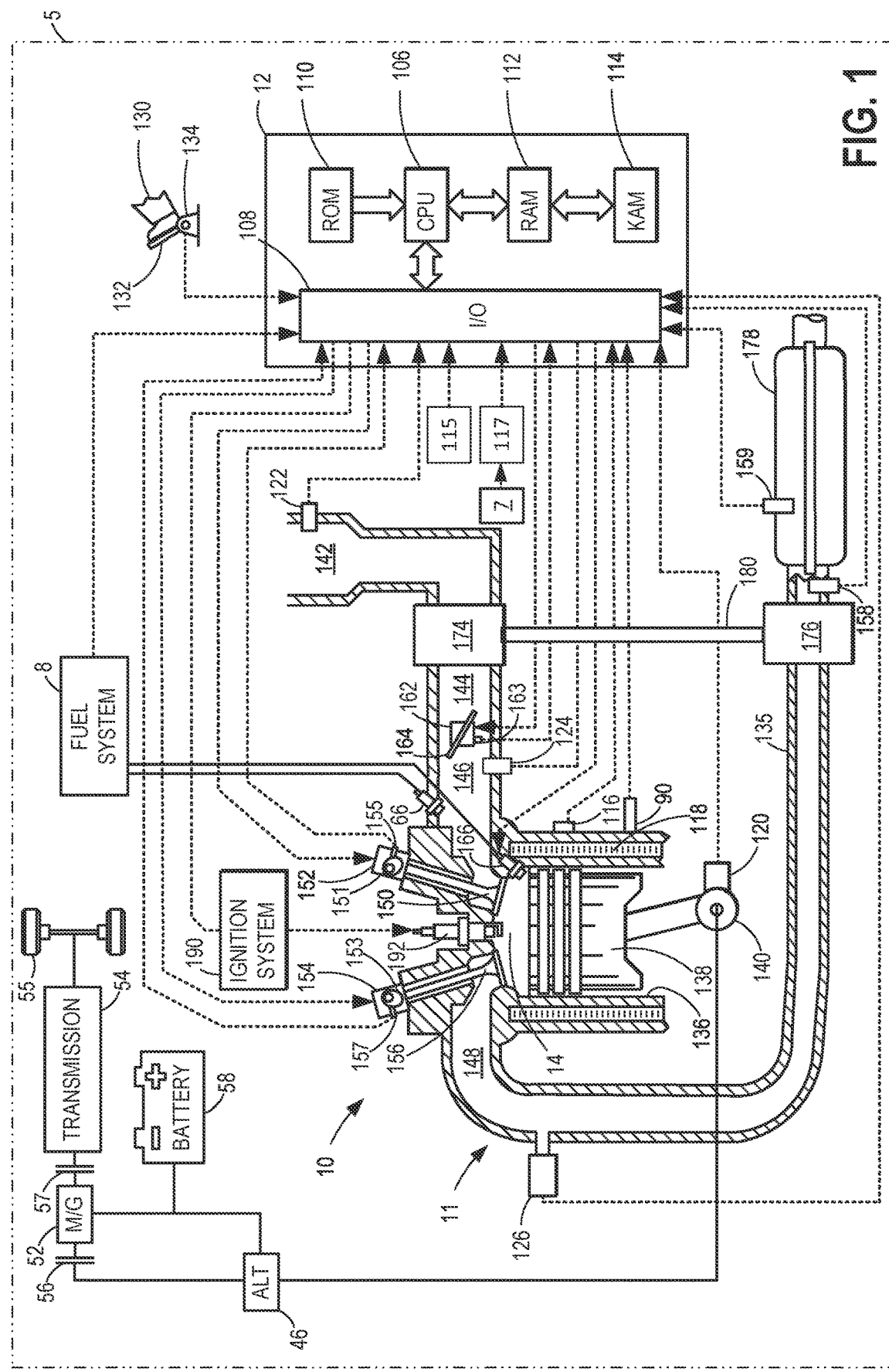
FIG. 1 shows a schematic depiction of an engine and powertrain of a vehicle.
Figure 2:
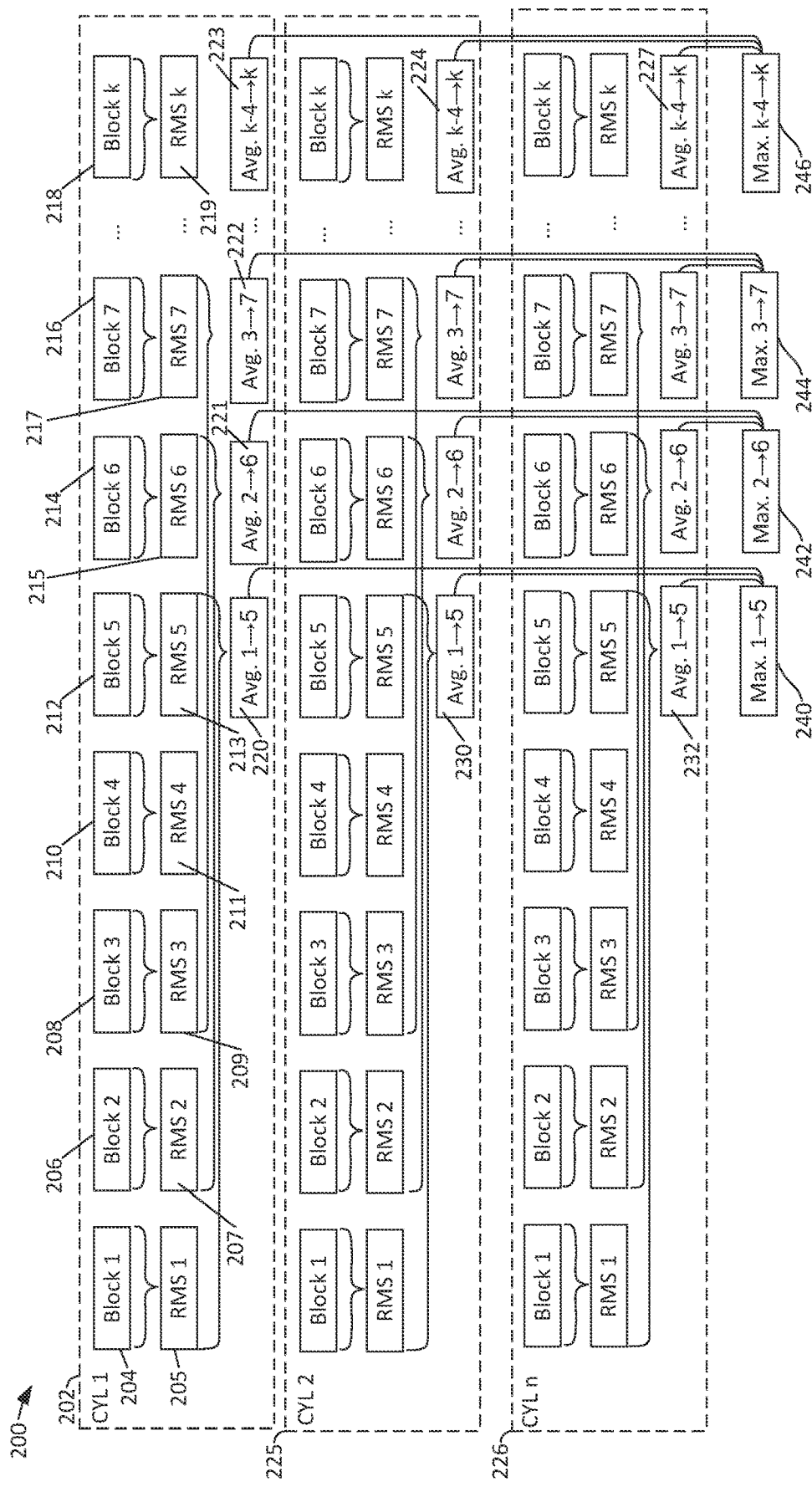
FIGS. 2-4 show graphic representations of methods for determining a spark plug fouling metric.
Figure 3:
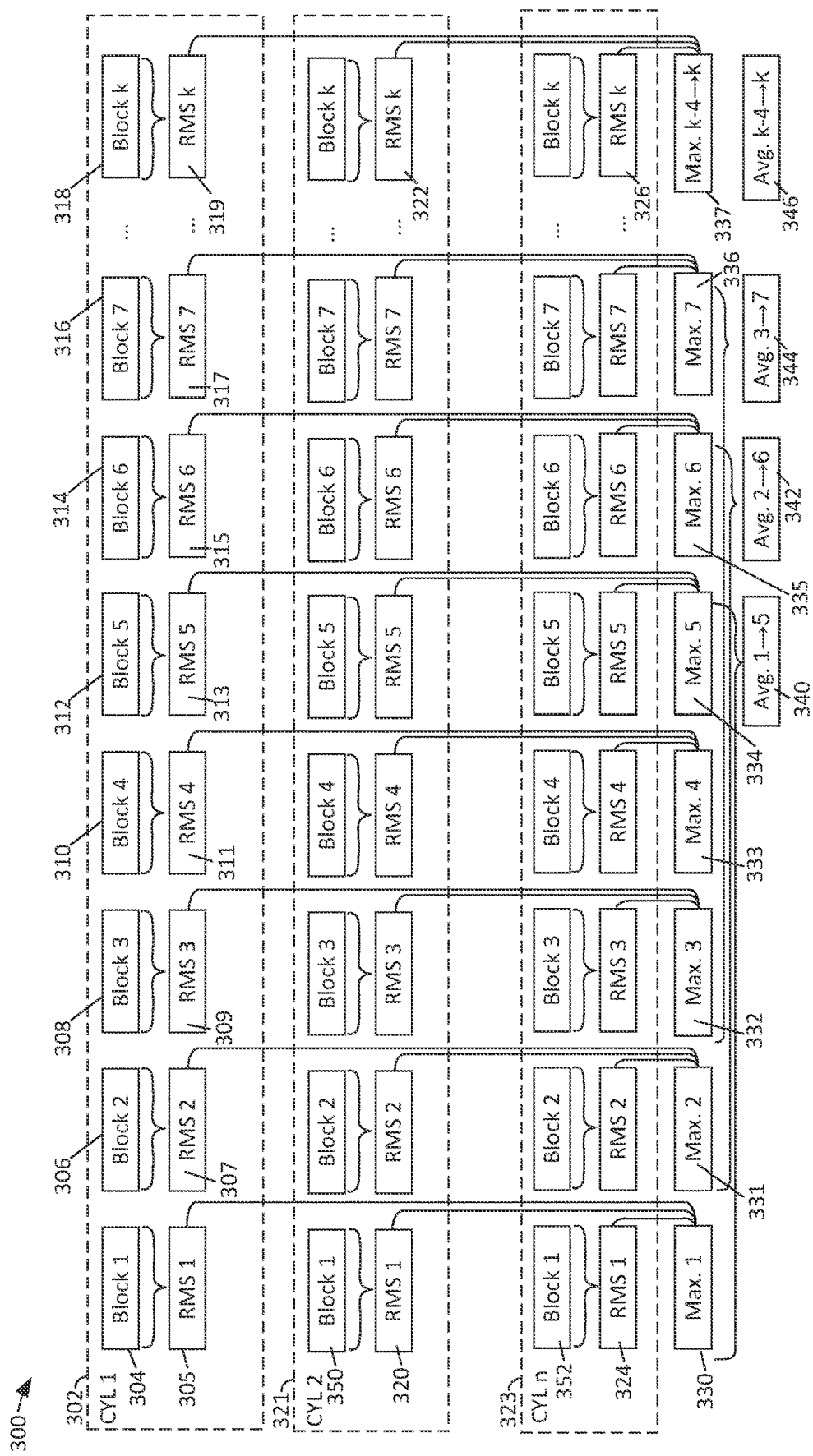
Figure 4:
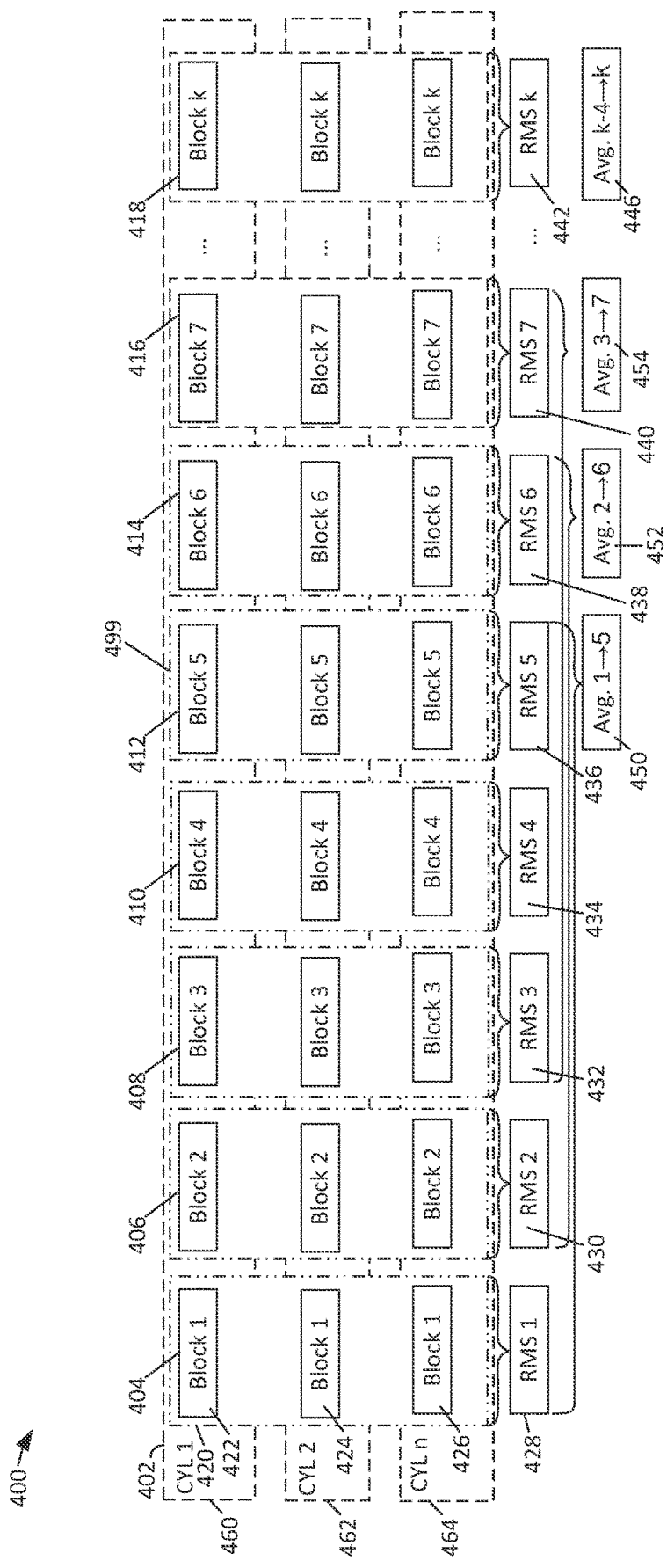
Figure 5:
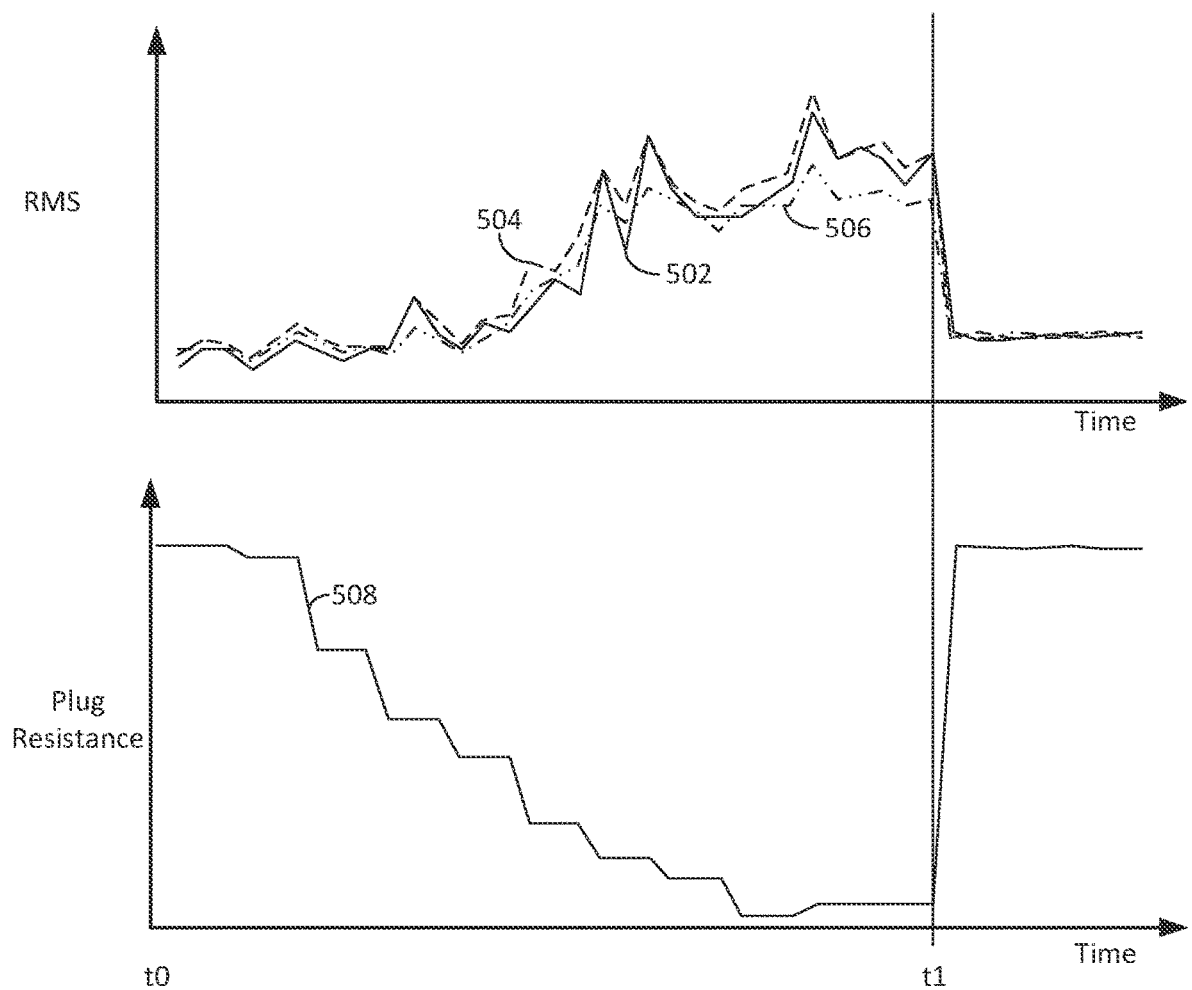
FIG. 5 shows plots of root mean square (RMS) values of engine crankshaft rate of speed change and spark plug resistance versus time.
Figure 6:
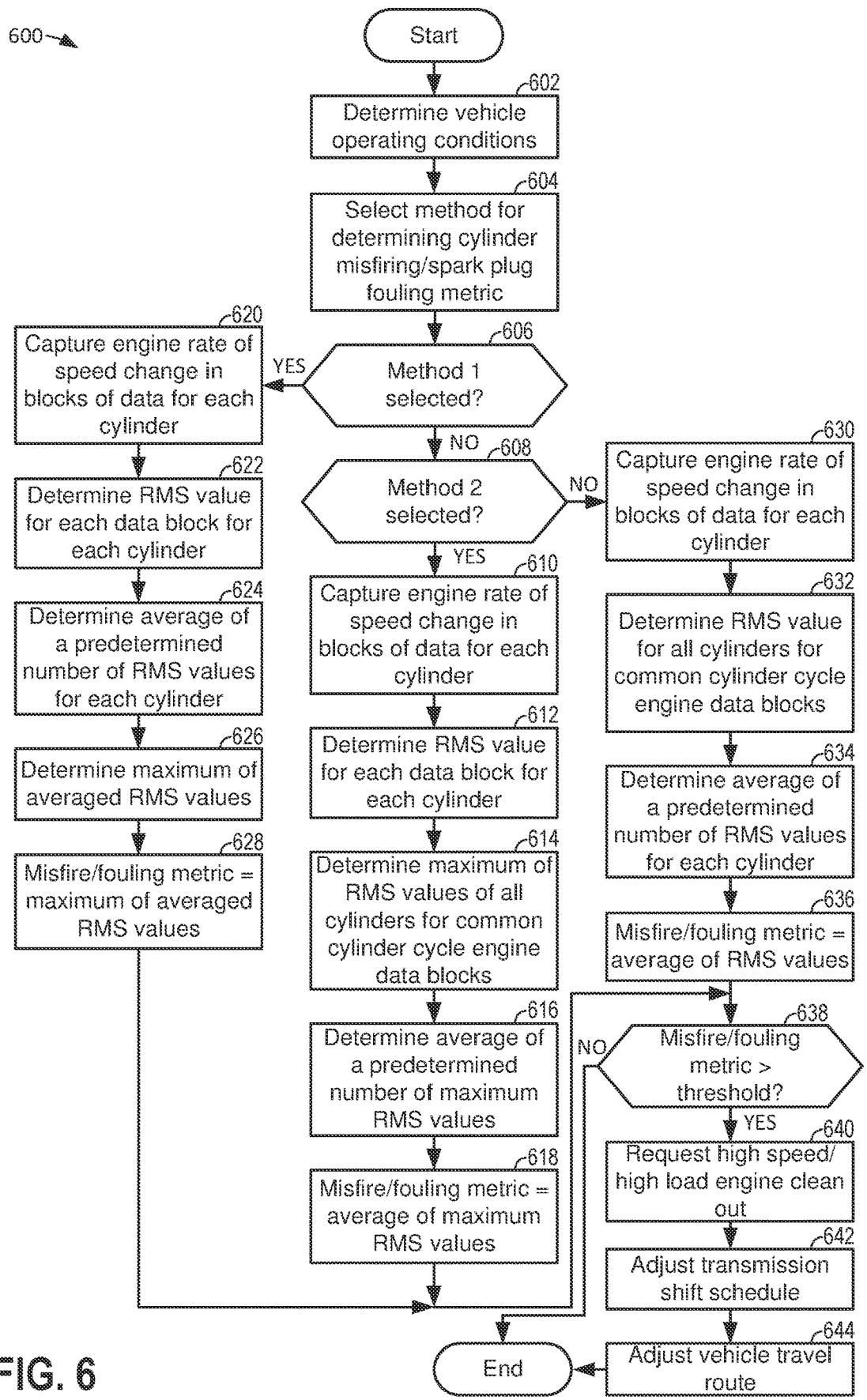
FIG. 6 shows a flow chart of a method for determining and mitigating spark plug fouling.

The following description relates to systems and methods for determining the presence or absence of spark plug fouling for an internal combustion engine. The engine may be included in a hybrid vehicle as shown in FIG. 1. Spark plug fouling may be determined from a value of a metric that may be determined via one of three methods. One of the three methods may be selected via a calibration variable or vehicle operating conditions. FIGS. 2-4 show graphic representations of three methods for determining a spark plug fouling metric. The methods may detect spark plug fouling via RMS rate of engine speed change values as shown in FIG. 5. A flowchart for selecting an appropriate method for detecting and compensating spark plug fouling is shown in FIG. 6.

Turning now to the figures, FIG. 1 depicts an example of a cylinder 14 of an internal combustion engine 10, which may be included in a vehicle 5. Engine 10 may be a variable displacement engine (VDE), as described further below. Engine 10 may be controlled at least partially by a control system, including a controller 12, and by input from a human vehicle operator 130 via a driver demand pedal 132 or an autonomous driver 117. In this example, driver demand pedal 132 includes a pedal position sensor 134 for generating a proportional pedal position signal. Cylinder (herein, also "combustion chamber") 14 of engine 10 may include combustion chamber walls 136 with a piston 138 positioned therein. Piston 138 may be coupled to a crankshaft 140 so that reciprocating motion of the piston is translated into rotational motion of the crankshaft. Crankshaft 140 may be coupled to at least one vehicle wheel 55 of vehicle 5 via a transmission 54, as further described below.

In some examples, vehicle 5 may be a hybrid vehicle with multiple sources of torque available to one or more vehicle wheels 55. In other examples, vehicle 5 is a conventional vehicle with only an engine. In the example shown, vehicle 5 includes engine 10 and an electric machine 52. Electric machine 52 may be a motor or a motor/generator. Crankshaft 140 of engine 10 and electric machine 52 are connected via transmission 54 to vehicle wheels 55 when one or more clutches 56 are engaged. In the depicted example, a first clutch 56 is provided between crankshaft 140 and electric machine 52, and a second clutch 57 is provided between electric machine 52 and transmission 54. Controller 12 may send a signal to an actuator of each clutch 56 to engage or disengage the clutch, so as to connect or disconnect crankshaft 140 from electric machine 52 and the components connected thereto, and/or connect or disconnect electric machine 52 from transmission 54 and the components connected thereto. Transmission 54 may be a gearbox, a planetary gear system, or another type of transmission.

Engine 10 may be rotated via electric machine 52 during starting or when engine 10 is operated as an air pump. Alternatively, a starter motor (not shown) may rotate engine 10 during starting or when engine 10 is operated as an air pump. The starter motor may engage crankshaft 140 via a flywheel (not shown).

The powertrain may be configured in various manners, including as a parallel, a series, or a series-parallel hybrid vehicle. Further, engine 10 and electric machine 52 may be coupled via a gear set instead of a clutch in some configurations. In some examples, electric machine 52 may also be operated as a generator to provide electrical power to charge system battery 58, for example, during a braking operation. It will be appreciated that in other examples, system battery 58 may be a typical starting, lighting, ignition (SLI) battery coupled to an alternator 46.

Alternator 46 may be configured to charge system battery 58 using engine torque via crankshaft 140 during engine running. In addition, alternator 46 may power one or more electrical systems of the engine, such as one or more auxiliary systems including a heating, ventilation, and air conditioning (HVAC) system, vehicle lights, an on-board entertainment system, and other auxiliary systems based on their corresponding electrical demands. In one example, a current drawn on the alternator may continually vary based on each of an operator cabin cooling demand, a battery charging requirement, other auxiliary vehicle system demands, and motor torque. A voltage regulator may be coupled to alternator 46 in order to regulate the power output of the alternator based upon system usage requirements, including auxiliary system demands.

Cylinder 14 of engine 10 can receive intake air via a series of intake passages 142 and 144 and an intake manifold 146. Intake manifold 146 can communicate with other cylinders of engine 10 in addition to cylinder 14. One or more of the intake passages may include one or more boosting devices, such as a turbocharger or a supercharger. For example, FIG. 1 shows engine 10 configured with a turbocharger, including a compressor 174 arranged between intake passages 142 and 144 and an exhaust turbine 176 arranged along an exhaust passage 135. Compressor 174 may be at least partially powered by exhaust turbine 176 via a shaft 180 when the boosting device is configured as a turbocharger. However, in other examples, such as when engine 10 is provided with a supercharger, compressor 174 may be powered by mechanical input from a motor or the engine and exhaust turbine 176 may be optionally omitted. In still other examples, engine 10 may be provided with an electric supercharger (e.g., an "eBooster"), and compressor 174 may be driven by an electric motor. In still other examples, engine 10 may not be provided with a boosting device, such as when engine 10 is a naturally aspirated engine.

A throttle 162 including a throttle plate 164 may be provided in the engine intake passages for varying a flow rate and/or pressure of intake air provided to the engine cylinders. For example, throttle 162 may be positioned downstream of compressor 174, as shown in FIG. 1, or may be alternatively provided upstream of compressor 174. A position of throttle 162 may be communicated to controller 12 via a signal from a throttle position sensor.

An exhaust manifold 148 can receive exhaust gases from other cylinders of engine 10 in addition to cylinder 14. An exhaust gas sensor 126 is shown coupled to exhaust manifold 148 upstream of an emission control device 178. Exhaust gas sensor 126 may be selected from among various suitable sensors for providing an indication of an exhaust gas air/fuel ratio (AFR), such as a linear oxygen sensor or UEGO (universal or wide-range exhaust gas oxygen), a two-state oxygen sensor or EGO, a HEGO (heated EGO), a NOx, a HC, or a CO sensor, for example. In the example of FIG. 1, exhaust gas sensor 126 is a UEGO sensor. Emission control device 178 may be a three-way catalyst, a NOx trap, various other emission control devices, or combinations thereof. In the example of FIG. 1, emission control device 178 may be a three-way catalyst or an oxidation catalyst. Exhaust manifold 148, emissions control device 178, exhaust gas sensor 126, and temperature sensors may be included in engine exhaust system 11.

Each cylinder of engine 10 may include one or more intake valves and one or more exhaust valves. For example, cylinder 14 is shown including at least one intake poppet valve 150 and at least one exhaust poppet valve 156 located at an upper region of cylinder 14. In some examples, each cylinder of engine 10, including cylinder 14, may include at least two intake poppet valves and at least two exhaust poppet valves located at an upper region of the cylinder. In this example, intake valve 150 may be controlled by controller 12 by cam actuation via cam actuation system 152, including one or more cams 151. Similarly, exhaust valve 156 may be controlled by controller 12 via cam actuation system 154, including one or more cams 153. The position of intake valve 150 and exhaust valve 156 may be determined by valve position sensors (not shown) and/or camshaft position sensors 155 and 157, respectively.

During some conditions, controller 12 may vary the signals provided to cam actuation systems 152 and 154 to control the opening and closing of the respective intake and exhaust valves. The intake and exhaust valve timing may be controlled concurrently, or any of a possibility of variable intake cam timing, variable exhaust cam timing, dual independent variable cam timing, or fixed cam timing may be used. Each cam actuation system may include one or more cams and may utilize one or more of variable displacement engine (VDE), cam profile switching (CPS), variable cam timing (VCT), variable valve timing (VVT), and/or variable valve lift (VVL) systems that may be operated by controller 12 to vary valve operation. In alternative examples, intake valve 150 and/or exhaust valve 156 may be controlled by electric valve actuation. For example, cylinder 14 may alternatively include an intake valve controlled via electric valve actuation and an exhaust valve controlled via cam actuation, including CPS and/or VCT systems. In other examples, the intake and exhaust valves may be controlled by a common valve actuator (or actuation system) or a variable valve timing actuator (or actuation system).

As further described herein, intake valve 150 and exhaust valve 156 may be deactivated during VDE mode via electrically actuated rocker arm mechanisms. In another example, intake valve 150 and exhaust valve 156 may be deactivated via a CPS mechanism in which a cam lobe with no lift is used for deactivated valves. Still other valve deactivation mechanisms may also be used, such as for electrically actuated valves. In one example, deactivation of intake valve 150 may be controlled by a first VDE actuator (e.g., a first electrically actuated rocker arm mechanism, coupled to intake valve 150) while deactivation of exhaust valve 156 may be controlled by a second VDE actuator (e.g., a second electrically actuated rocker arm mechanism, coupled to exhaust valve 156). In alternate examples, a single VDE actuator may control deactivation of both intake and exhaust valves of the cylinder. In still other examples, a single cylinder valve actuator deactivates a plurality of cylinders (both intake and exhaust valves), such as all of the cylinders in an engine bank, or a distinct actuator may control deactivation for all of the intake valves while another distinct actuator controls deactivation for all of the exhaust valves of the deactivated cylinders. It will be appreciated that if the cylinder is a non-deactivatable cylinder of the VDE engine, then the cylinder may not have any valve deactivating actuators. Each engine cylinder may include the valve control mechanisms described herein. Intake and exhaust valves are held in closed positions over one or more engine cycles when deactivated so as to prevent flow into or out of cylinder 14.

Cylinder 14 can have a compression ratio, which is a ratio of volumes when piston 138 is at bottom dead center (BDC) to top dead center (TDC). In one example, the compression ratio is in the range of 9:1 to 22:1, depending on whether engine 10 is configured as a gasoline or diesel engine. The compression ratio may also be increased if direct injection is used due to its effect on engine knock.

Each cylinder of engine 10 may include a spark plug 192 for initiating combustion when the engine is configured to combust gasoline or petrol. An ignition system 190 can provide an ignition spark to combustion chamber 14 via spark plug 192 in response to a spark advance signal from controller 12, under select operating modes. Spark timing may be adjusted based on engine operating conditions and driver torque demand. For example, spark may be provided at minimum spark advance for best torque (MBT) timing to maximize engine power and efficiency. Controller 12 may input engine operating conditions, including engine speed, engine load, and exhaust gas AFR, into a look-up table and output the corresponding MBT timing for the input engine operating conditions. In other examples, spark may be retarded from MBT, such as to expedite catalyst warm-up during engine start or to reduce an occurrence of engine knock.

In some examples, each cylinder of engine 10 may be configured with one or more fuel injectors for providing fuel thereto. As a non-limiting example, cylinder 14 is shown including a direct fuel injector 166 and a port fuel injector 66. Fuel injectors 166 and 66 may be configured to deliver fuel received from a fuel system 8. Fuel system 8 may include one or more fuel tanks, fuel pumps, and fuel rails. Fuel injector 166 is shown coupled directly to cylinder 14 for injecting fuel directly therein in proportion to a pulse width of a signal received from controller 12. Port fuel injector 66 may be controlled by controller 12 in a similar way. In this manner, fuel injector 166 provides what is known as direct injection (hereafter also referred to as "DI") of fuel into cylinder 14. While FIG. 1 shows fuel injector 166 positioned to one side of cylinder 14, fuel injector 166 may alternatively be located overhead of the piston, such as near the position of spark plug 192. Such a position may increase mixing and combustion when operating the engine with an alcohol-based fuel due to the lower volatility of some alcohol-based fuels. Alternatively, the injector may be located overhead and near the intake valve to increase mixing. Fuel may be delivered to fuel injectors 166 and 66 from a fuel tank of fuel system 8 via fuel pumps and fuel rails. Further, the fuel tank may have a pressure transducer providing a signal to controller 12.

Fuel injectors 166 and 66 may be configured to receive different fuels from fuel system 8 in varying relative amounts as a fuel mixture and further configured to inject this fuel mixture directly into cylinder. For example, fuel injector 166 may receive alcohol fuel and fuel injector 66 may receive gasoline. Further, fuel may be delivered to cylinder 14 during different strokes of a single cycle of the cylinder. For example, directly injected fuel may be delivered at least partially during a previous exhaust stroke, during an intake stroke, and/or during a compression stroke. Port injected fuel may be injected after intake valve closing of a previous cycle of the cylinder receiving fuel and up until intake valve closing of the present cylinder cycle. As such, for a single combustion event (e.g., combustion of fuel in the cylinder via spark ignition or compression ignition), one or multiple injections of fuel may be performed per cycle via either or both injectors. The multiple DI injections may be performed during the compression stroke, intake stroke, or any appropriate combination thereof in what is referred to as split fuel injection.

Controller 12 is shown in FIG. 1 as a microcomputer, including a microprocessor unit 106, input/output ports 108, an electronic storage medium for executable programs (e.g., executable instructions) and calibration values shown as non-transitory read-only memory chip 110 in this particular example, random access memory 112, keep alive memory 114, and a data bus. Controller 12 may receive various signals from sensors coupled to engine 10, including signals previously discussed and additionally including a measurement of inducted mass air flow (MAF) from a mass air flow sensor 122; an engine coolant temperature (ECT) from a temperature sensor 116 coupled to a cooling sleeve 118; a catalyst inlet temperature from a temperature sensor 158 coupled to exhaust passage 135; a catalyst temperature from temperature sensor 159; a crankshaft position signal from a Hall effect sensor 120 (or other type) coupled to crankshaft 140; throttle position from a throttle position sensor 163; signal UEGO from exhaust gas sensor 126, which may be used by controller 12 to determine the air-fuel ratio of the exhaust gas; engine vibrations via sensor 90; and an absolute manifold pressure signal (MAP) from a MAP sensor 124. An engine speed signal, RPM, may be generated by controller 12 from crankshaft position. The manifold pressure signal MAP from MAP sensor 124 may be used to provide an indication of vacuum or pressure in the intake manifold. Controller 12 may infer an engine temperature based on the engine coolant temperature.

Controller 12 receives signals from the various sensors of FIG. 1 and employs the various actuators of FIG. 1 to adjust engine operation based on the received signals and instructions stored on a memory of the controller. For example, the controller may transition the engine to operating in VDE mode by actuating valve actuators 152 and 154 to deactivate selected cylinders. In addition, controller 12 may receive input from and provide data to human/machine interface 115. In one example, human/machine interface 115 may be a touch screen device, a display and keyboard, a phone, or other known device.

As described above, FIG. 1 shows only one cylinder of a multi-cylinder engine. As such, each cylinder may similarly include its own set of intake/exhaust valves, fuel injector(s), spark plug, etc. It will be appreciated that engine 10 may include any suitable number of cylinders, including 2, 3, 4, 5, 6, 8, 10, 12, or more cylinders. Further, each of these cylinders can include some or all of the various components described and depicted by FIG. 1 with reference to cylinder 14.

During selected conditions, such as when the full torque capability of engine 10 is not requested, one of a first or a second cylinder group may be selected for deactivation by controller 12 (herein also referred to as a VDE mode of operation). During the VDE mode, cylinders of the selected group of cylinders may be deactivated by shutting off respective fuel injectors 166 and 66. Further, valves 150 and 156 may be deactivated and held closed over one or more entire engine cycles. While fuel injectors of the disabled cylinders are turned off, the remaining enabled cylinders continue to carry out combustion, with corresponding fuel injectors and intake and exhaust valves active and operating. To meet torque requirements, the controller adjusts the amount of air entering active engine cylinders. Thus, to provide equivalent engine torque that an eight cylinder engine produces at 0.2 engine load and a particular engine speed, the active engine cylinders may operate at higher pressures than engine cylinders when the engine is operated with all engine cylinders being active. This requires higher manifold pressures, resulting in lowered pumping losses and increased engine efficiency. Additionally, the lower effective surface area (from only the active cylinders) exposed to combustion reduces engine heat losses, increasing the thermal efficiency of the engine.

Navigation system 7 may provide data to and receive data from autonomous driver 117 and controller 12. For example, upon detecting spark plug fouling, controller 12 may request that autonomous driver 117 perform a spark plug cleaning drive to remove fouling from spark plug 192. Autonomous driver 117 may request a travel route where engine 10 may reach higher speeds and loads to that carbon deposits may be cleared from spark plug 192. Navigation system 7 may provide travel route instructions (e.g., turn right, turn left, increase vehicle speed, decrease vehicle speed, etc.) to autonomous driver 117 and autonomous driver 117 may deliver a driver demand torque to controller 12 according to the travel route instructions.

Thus, the system of FIG. 1 provides for a system for operating an engine, comprising: an internal combustion engine; and a controller including executable instructions stored in non-transitory memory that cause the controller to generating a group of root mean square values comprising a root mean square value for each cylinder of the engine, generating a maximum value from the group of root mean square values; and to adjust operation of the internal combustion engine in response to an average value determined from a group of maximum values that includes the maximum value. In a first example, the system further comprises additional instructions to generate the average value by averaging values in the group of maximum values. In a second example that may include the first example, the system further comprises: a torque actuator; and additional instructions to adjust the torque actuator to adjust operation of the internal combustion engine. In a third example that may include one or both of the first and second example, the system includes where the torque actuator is a throttle. In a fourth example that may include one or more of the first through third examples, the system further comprises additional instructions to generate root mean square values to include in the group of root mean square values. In a fifth example that may include one or more of the first through fourth examples, the system includes where the root mean square values are determined from blocks of engine data.

Referring now to FIG. 2, a graphic representation of a first method for determining a spark plug fouling metric is shown. The method of FIG. 2 may be performed via the system of FIG. 1 in cooperation with the method of FIG. 6. The method of FIG. 2 may be incorporated into the method of FIG. 6. In addition, the method of FIG. 2 may be included in the system of FIG. 1 as executable instructions stored in controller memory.

In this example, method 200 is described with regard to an engine that has n cylinders, where n is an integer number between 1 and 12. Operations and/or calculations for each of the engine's cylinders are shown within regions 202, 225, and 226. The operations in region 202 apply to engine cylinder number one, operations in region 225 apply to engine cylinder number two, and so on. Operations between cylinder number two and cylinder number n are not shown so that the graphic may be shown within reasonable size limits. The operations may be performed each time a new engine data block is complete (e.g., filled with the requisite number of engine data values). If the engine is stopped before a block of engine data is filled with the requisite number of engine data values, the partial block of engine data may be ignored and/or discarded.

Engine data is stored in consecutive blocks of data that may include one or more data values or samples. For example, a block of data may include 50 data values. The blocks of data in FIG. 2 are represented via named rectangles identified with a block reference (e.g., "Block 1"). The data blocks for cylinders 1-n are indicated as blocks 1-k. For example, rectangles at 204, 206, 208, 210, 212, 214, 216, and 218 represent individual engine data storage blocks. Block 1 is the oldest block of data, Block 2 is the second oldest block of data, and Block k is the most recent block of data. Data blocks for engine data are included for each cylinder. Cylinder data in blocks labeled "Block 1" for cylinder number one is captured or determined in the same engine cycles as cylinder data labeled "Block 1" in other engine cylinders. Thus, if the engine is a four cylinder engine, four data blocks named "Block X", where X is a variable that is dependent on the engine cycles during which the data was captured or determined, are generated to store data from the four cylinders, and each of the four data blocks includes a predetermined number of values representing normalized rates of engine speed change during expansion strokes of a cylinder that is associated with the data block. For example, cylinder number one "Block 1" indicated at 204 may include 50 rates of engine speed changes for 50 engine cycles that are determined during an expansion stroke of cylinder number one. The data blocks identified as "Block 1" for cylinder number two and for cylinder number n may include similar data captured during the same 50 engine cycles, except this data is for cylinder numbers two and n respectively. In this example, engine data for cylinder number one is stored in blocks 204, 206, 208, 210, 212, 214, 216, and 218. The ellipsis between the seventh block 216 and the k$^{th}$ block 218 indicates that other data blocks are present, but not shown for illustration purposes.

The first method also includes determining consecutive root mean square (RMS) values for the engine data that is stored in each block of data. For example, a RMS value for the data stored in the memory represented by the rectangle "Block 1" is stored in memory represented by the named rectangle "RMS 1" in region 202, which applied to cylinder number one. Thus, the rectangle labeled "RMS 1" indicated at 205 represents the data corresponding to the RMS value for the data that is stored in the block of data named "Block 1" as indicated at 204. The RMS value for each rectangle with a RMS label (e.g., 205, 207, 209, 211, 213, 215, 217, and 219) may be determined via the following equation:

$$\text{RMS} = \sqrt{\frac{\sum_{i=1}^{n} (\min\{x_i, 0\})^2}{n}}$$

where RMS is the root mean square value of the data, n is the total number of data points in a block of data (e.g., 50), i is an index variable into the block of data, min is a function that returns the lower value of argument $x_i$ and zero, and $x_i$ is the data value at index i. The min function with arguments $x_i$ and 0 serves to apply an upper bound of zero to the data value $x_i$. In this example, there is a RMS value that is determined for each block of data. For example, the RMS data for "Block 1" data (e.g., 204) is indicated at the rectangle "RMS 1" shown at 205. Similarly, the RMS data for "Block k" data (e.g., 218) is indicated at rectangle "RMS k" shown at 219. Method 200 may store a predetermined number of RMS data values (e.g., 5) in memory that are a basis for determining average values. In some examples, a generalized version of RMS calculation with the data $x_i$ clipped at an upper bound (UB) and/or lower bound (LB) may be applied according to the following equation:

$$RMS = \sqrt{\frac{\sum_{i=1}^{n}(\max\{\min\{x_i, UB\}, LB\})^2}{n}}$$

Method 200 determines average values from two or more RMS values. In this example, method 200 averages five RMS values. For example, rectangle 220 represents an average of RMS values represented by rectangles 205, 207, 209, 211, and 213. The average of RMS values begins to be determined when the number of determined RMS values is equal to the number of RMS values that are desired to be averaged. For example, no average is determined when there is only one RMS value as shown at 205. Rather, the average of RMS values begins to be determined once the number of RMS values is equal to the number of RMS values to be averaged, which is five in this example. Thus, the first average of RMS values represented by rectangle 220 is calculated after the fifth RMS value is determined as represented by rectangle 213. The next average RMS value at rectangle 221 is determined from the previous five RMS values that are represented by the rectangles at 207, 209, 211, 213, and 215. Thus, the averaging window of five RMS values slides with the newest RMS value. Similarly, once the seventh RMS value is determined as represented by rectangle 217, the third average RMS value is determined as indicated by rectangle 222 from the RMS values represented by rectangles 209, 211, 213, 215, and 217. Block k of engine data, where k is an integer value representing the most current whole block of engine data, is indicated at rectangle 218. The RMS value for the $k^{th}$ block of engine data is represented by rectangle 219. The average of the RMS value corresponding to the $k^{th}$ block of engine data and four prior RMS values corresponding to the four prior blocks of engine data is represented by rectangle 223.

RMS values and average values for cylinders 2 through n are determined in a similar way as those described for cylinder number one and as indicated in regions 225 and 226. Likewise, the $k^{th}$ engine data blocks, $k^{th}$ RMS values, and $k^{th}$ average RMS values are shown for cylinders 2 and n in regions 225 and 226.

Maximum values for the averaged RMS values are determined for each average RMS value for each cylinder. For example, a maximum value for the averaged RMS values indicated at rectangles 220, 230, and 232 is determined and represented by rectangle 240 for the first RMS values. The averaged RMS values for cylinders 3 to n-1 are determined but are not shown due to figure size limitations. The most recent maximum RMS value for all of the cylinders is represented by rectangle 246 and it may be determined from the average RMS values indicated at rectangles 223, 224, and 227. The averaged RMS values for cylinders 3 to n-1 are determined but are not shown due to figure size limitations. The most recent maximum of averaged RMS values may be described as an engine misfire or spark plug fouling metric.

In this way, a RMS value may be determined for each block of engine data that is associated with a particular cylinder. Two or more RMS values associated with a particular cylinder may be averaged for the cylinder. A maximum value of the averaged RMS values for all of the cylinders may be determined to generate an engine misfire or spark plug fouling metric.

Referring now to FIG. 3, a graphic representation of a second method for determining a spark plug fouling metric is shown. The method of FIG. 3 may be performed via the system of FIG. 1 in cooperation with the method of FIG. 6. The method of FIG. 3 may be incorporated into the method of FIG. 6. In addition, the method of FIG. 3 may be included in the system of FIG. 1 as executable instructions stored in controller memory.

In this example, similar to method 200, method 300 is described with regard to an engine that has n cylinders, where n is an integer number between 1 and 12. Operations and/or calculations for each of the engine's cylinders are shown within regions 302, 321, and 323. The operations in region 302 apply to engine cylinder number one, operations in region 321 apply to engine cylinder number two, and so on. Operations between cylinder number two and cylinder number n are not shown so that the graphic may be shown within reasonable size limits. The operations may be performed each time a new engine data block is complete (e.g., filled with the requisite number of engine data values). If the engine is stopped before a block of engine data is filled with the requisite number of engine data values, the partial block of engine data may be ignored and/or discarded.

Similar to method 200, engine data is stored in consecutive blocks of data that may include one or more data values or samples. The blocks of data in FIG. 3 are represented via named rectangles identified with a block reference (e.g., "Block 1"). The data blocks for cylinders 1-n are indicated as blocks 1-k. For example, rectangles at 304, 306, 308, 310, 312, 314, 316, and 318 represent individual engine data storage blocks. Block 1 is the oldest block of data (e.g. first data collected), Block 2 is the second oldest block of data, and Block k is the most recent block of data. Data blocks for engine data are included for each cylinder. Cylinder data in blocks labeled "Block 1" for cylinder number one is captured or determined in the same engine cycles as cylinder data labeled "Block 1" in other engine cylinders. Thus, if the engine is a four cylinder engine, four data blocks named "Block X", where X is a variable that is dependent on the engine cycles during which the data was captured or determined, are generated to store data from the four cylinders, and each of the four data blocks includes a predetermined number of values representing normalized rates of engine speed change during expansion strokes of a cylinder that is associated with the data block. For example, cylinder number one "Block 1" indicated at 304 may include 50 rates of engine speed changes for 50 engine cycles that are determined during an expansion stroke of cylinder number one. The data blocks identified as "Block 1" for cylinder number two and for cylinder number n may include similar data captured during the same 50 engine cycles, except this data is for cylinder numbers two and n respectively. In this example, engine data for cylinder number one is stored in blocks 304, 306, 308, 310, 312, 314, 316, and 318. The ellipsis between the seventh block 316 and the $k^{th}$ block 318 indicates that other data blocks are present, but not shown for illustration purposes.

Similar to method 200, the second method also includes determining consecutive root mean square (RMS) values for the engine data that is stored in each block of data. For example, a RMS value for the data stored in the memory represented by the rectangle "Block 1" is stored in memory represented by the named rectangle "RMS 1" in region 302, which applied to cylinder number one. Thus, the rectangle labeled "RMS 1" indicated at 305 represents the data corresponding to the RMS value for the data that is stored in the block of data named "Block 1" as indicated at 304. The RMS value for each rectangle with a RMS label (e.g., 305, 307, 309, 311, 313, 315, 317, and 319) may be determined as previously mentioned. Thus, the RMS data for "Block 1" data (e.g., 304) is indicated at the rectangle "RMS 1" shown at 305. Similarly, the RMS data for "Block k" data (e.g., 318) is indicated at rectangle "RMS k" shown at 319.

A maximum value for the RMS values determined from data in the data blocks constructed with data from same engine cycles is determined. For example, number one data blocks from the first through $n^{th}$ cylinders are indicated by rectangles 304, 350, and 352. Data in these data blocks is captured during same engine cycles (e.g., 50 engine cycles). The RMS values corresponding to the data in these data blocks is represented by rectangles 305, 320, and 324. The maximum value of the RMS values in rectangles 305, 320, and 324 is represented by rectangle 330. The averaged RMS values for cylinders 3 to n-1 are determined but are not shown due to figure size limitations. The maximum value of the RMS values is determined following determination of the RMS values for the engine cycles during which data was gathered for data blocks marked "Block 1" for each of the cylinders as indicated at 304, 350, and 352. Thus, if the RMS value for rectangle 305 is 0.4, the RMS value for rectangle 350 is 0.3, and the RMS value for rectangle 352 is 0.35, the maximum value at rectangle 330 is 0.4. Each time data blocks are constructed and RMS values determined using data from a predetermined number of engine cycles, a new maximum RMS value is determined as shown in FIG. 2. A series of maximum values for data blocks beginning with block 1 values and ending with block k values are represented via rectangles 330-337.

Method 300 determines averaged maximum values from two or more maximum RMS values. In this example, method 300 averages five maximum RMS values. For example, rectangle 340 represents an average of maximum RMS values represented by rectangles 330, 331, 332, 333, and 334. The average of maximum RMS values begins to be determined when the number of determined maximum RMS values is equal to the number of maximum RMS values that are desired to be averaged. For example, no average is determined when there is only one maximum RMS value as shown at 330. Rather, the average of maximum RMS values begins to be determined once the number of maximum RMS values is equal to the number of maximum RMS values to be averaged, which is five in this example. Therefore, the first average of maximum RMS values represented by rectangle 340 is calculated after the fifth maximum RMS value is determined as represented by rectangle 334. The next average maximum RMS value at rectangle 342 is determined from the previous five RMS values that are represented by the rectangles at 331, 332, 333, 334, and 335. Accordingly, the averaging window of five maximum RMS values slides with the newest maximum RMS value. Similarly, once the seventh maximum RMS value is determined as represented by rectangle 336, the third average maximum RMS value is determined as indicated by rectangle 344 from the maximum RMS values represented by rectangles 332, 333, 334, 335, and 336. The most recent averaged maximum RMS value for all of the cylinders is represented by rectangle 346 and it may be determined from the average maximum RMS values indicated at rectangle 337 and the prior four most recent maximum RMS values (not shown). The most recent averaged maximum RMS value at 346 may be described as an engine misfire or spark plug fouling metric.

In this way, a RMS value may be determined for each block of engine data that is associated with a particular cylinder. A maximum of the RMS values from each engine cylinder data is determined and a plurality of maximum RMS values from different groups of data blocks may be averaged to generate an engine misfire or spark plug fouling metric.

Referring now to FIG. 4, a graphic representation of a third method for determining a spark plug fouling metric is shown. The method of FIG. 4 may be performed via the system of FIG. 1 in cooperation with the method of FIG. 6. The method of FIG. 4 may be incorporated into the method of FIG. 6. In addition, the method of FIG. 4 may be included in the system of FIG. 1 as executable instructions stored in controller memory.

In this example, similar to method 200, method 400 is described with regard to an engine that has n cylinders, where n is an integer number between 1 and 12. Operations and/or calculations for each of the engine's cylinders are shown within regions 460, 462, and 464. The operations in region 460 apply to engine cylinder number one, operations in region 462 apply to engine cylinder number two, and so on. Operations between cylinder number two and cylinder number n are not shown so that the graphic may be shown within reasonable size limits. The operations may be performed each time a new engine data block is complete (e.g., filled with the requisite number of engine data values). If the engine is stopped before a block of engine data is filled with the requisite number of engine data values, the partial block of engine data may be ignored and/or discarded.

Similar to method 200, engine data is stored in consecutive blocks of data that may include one or more data values or samples. The blocks of data in FIG. 4 are represented via named rectangles identified with a block reference (e.g., "Block 1"). The data blocks for cylinders 1-n are indicated as blocks 1-k. For example, rectangles at 404, 406, 408, 410, 412, 414, 416, and 418 represent individual engine data storage blocks. Block 1 is the oldest block of data (e.g. first data collected), Block 2 is the second oldest block of data, and Block k is the most recent block of data. Data blocks for engine data are included for each cylinder. Cylinder data in blocks labeled "Block 1" for cylinder number one is captured or determined in the same engine cycles as cylinder data labeled "Block 1" in other engine cylinders. Thus, if the engine is a four cylinder engine, four data blocks named "Block X", where X is a variable that is dependent on the engine cycles during which the data was captured or determined, are generated to store data from the four cylinders, and each of the four data blocks includes a predetermined number of values representing normalized rates of engine speed change during expansion strokes of a cylinder that is associated with the data block. For example, cylinder number one "Block 1" indicated at 404 may include 50 rates of engine speed changes for 50 engine cycles that are determined during an expansion stroke of cylinder number one.

The data blocks identified as "Block 1" for cylinder number two and for cylinder number n may include similar data captured during the same 50 engine cycles, except this data is for cylinder numbers two and n respectively. In this example, engine data for cylinder number one is stored in blocks 404, 406, 408, 410, 412, 414, 416, and 418. The ellipsis between the seventh block 416 and the $k^{th}$ block 418 indicates that other data blocks are present, but not shown for illustration purposes.

Like Method 200, method 400, also determines consecutive RMS values, but method 400 determines a RMS value for all the cylinders of the engine for the same engine cycles. For example, engine data labeled "Block 1" for engine cylinders one, two, and n are represented via rectangles 422, 424, and 426. A RMS value for all of the rates of engine speed change in these blocks is determined and represented via rectangle 428. The engine data in these data blocks may be described as being within an engine cycle group as indicated at 420. Each time a new group of engine data blocks are captured or determined, a RMS value for the new group of data is determined. Thus, a series of RMS values may be determined as shown at 428, 430, 432, 434, 436, 438, 440, and 442.

Method 400 determines average values from two or more RMS values. In this example, method 400 averages five RMS values. For example, rectangle 450 represents an average of RMS values represented by rectangles 428, 430, 432, 434, and 436. The average of RMS values begins to be determined when the number of determined RMS values is equal to the number of RMS values that are desired to be averaged. For example, no average is determined when there is only one RMS value as shown at 428. Rather, the average of RMS values begins to be determined once the number of RMS values is equal to the number of RMS values to be averaged, which is five in this example. Thus, the first average of RMS values represented by rectangle 450 is calculated after the fifth RMS value is determined as represented by rectangle 436. The next average RMS value at rectangle 452 is determined from the previous five RMS values that are represented by the rectangles at 430, 432, 434, 436, and 438. Thus, the averaging window of five RMS values slides with the newest RMS value. Similarly, once the seventh RMS value is determined as represented by rectangle 440, the third average RMS value is determined as indicated by rectangle 454 from the RMS values represented by rectangles 432, 434, 436, 438, and 440. A RMS value for the group of $k^{th}$ block engine data is represented by rectangle 442. The average of the RMS value corresponding to the group of $k^{th}$ block of engine data and four prior RMS values corresponding to the four prior groups of block engine data is represented by rectangle 446. The most recent averaged maximum RMS value at 446 may be described as an engine misfire or spark plug fouling metric.

In this way, a RMS value may be determined for engine data in a group of data blocks that were captured or determined during same engine cycles. An engine misfire or spark plug fouling metric may be determined by determining an average of the RMS values.

Referring now to FIG. 5, prophetic plots of RMS rates of engine speed change and spark plug resistance versus time are shown. The first plot from the top of FIG. 5 is a plot of RMS rates of engine speed change versus time. The vertical axis represents RMS rates of engine speed change and the RMS value increases in the direction of the vertical axis arrow. The horizontal axis represents time and time increases from the left side of the plot to the right side of the plot.

The second plot from the top of FIG. 5 is a plot of spark plug resistance versus time. The vertical axis represents spark plug resistance and spark plug resistance increases in the direction of the vertical axis arrow. The horizontal axis represents time and time increases from the left side of the plot to the right side of the plot. Trace 508 represents spark plug resistance.

In the first plot from the top of FIG. 5, the RMS values have been computed via method 200, method 300, and method 400. In particular, solid line 502 represents RMS values as determined via method 200. Dashed line 504 represents RMS values as determined via method 300. Dash-dot-dot line 506 represents RMS values as determined via method 400. The RMS values are calculated using a same set of engine rate of speed change values stored in data blocks as previously mentioned.

At time t0, the spark plug resistance is high, which indicates that there is little carbonaceous soot on the spark plug. The RMS values at this time are low, which indicates stable combustion (e.g., no misfires, partial burns, and late burns).

Between time t0 and time t1, the RMS values increase while the spark plug resistance decreases. The trends in the RMS traces and the spark plug resistance trace indicate that soot is accumulating on the spark plug and that the engine is misfiring or exhibiting poor combustion quality more frequently as the spark plug resistance decreases. The time duration between time t0 and time t1 may include multiple engine starts where the engine is run cold at low speeds and loads for short durations of time.

At time t1, an engine clean out is performed where the engine is operated at higher engine speeds and loads. Operating the engine at higher speeds and loads may increase temperatures within the engine cylinder and clear carbonaceous soot from the spark plug. The spark plug resistance increases and the RMS values decrease shortly after the engine clean out begins.

In this way, poor combustion quality may be detected and overcome. The RMS traces differ slightly, but they trend similarly. Thus, the RMS values may be a good indicator of when it may be desirable to perform an engine clean out cycle.

Referring now to FIG. 6, a method for determining an engine misfire/spark plug fouling metric and compensating for same is shown. Method 600 may be included in and may cooperate with the system of FIG. 1. At least portions of method 600 may be incorporated in the system of FIG. 1 as executable instructions stored in non-transitory memory. In addition, other portions of method 600 may be performed via a controller transforming operating states of devices and actuators in the physical world. The controller may employ actuators and sensors described herein to adjust engine operation. Further, method 600 may determine selected control parameters from sensor inputs.

At 602, method 600 determines vehicle operating conditions. Vehicle operating conditions may include, but are not limited to vehicle speed, driver demand torque, engine speed, engine load, ambient air temperature, barometric pressure, engine air-fuel ratio, and humidity. Method 600 proceeds to 604.

At 604, method 600 selects one of three available methods for determining an engine misfire/spark plug fouling metric. In one example, method 600 may select the method to activate based on a variable that is in controller memory. The variable may be programmed during vehicle manufacturing. In other examples, method 600 may select one of the three methods based on vehicle operating conditions. For example, a first method (e.g., method 200 of FIG. 2) may be selected when the engine is operating in a first speed/load range. The second method (e.g., method 300 of FIG. 3) may be selected when the engine is operating in a second speed/load range. The third method may be selected when the engine is operating in a third speed/load range. In addition, in some examples, an engine may be prone to fouling of selected spark plugs as compared to other engine spark plugs due to fuel injector positioning, air turbulence in a cylinder, and other factors. Method 200 includes sliding window average calculations that require more memory and a higher computational load than methods 300 and 400. Therefore, method 300 or 400 may be selected to reduce memory and computational loads. Method 300 may be more sensitive to spark plug fouling compared to method 200 due to the maximum being determined before the averaging window. The choice of method 400 over method 200 and method 300 may be based on a desired behavior of the spark plug fouling diagnostic. For example, method 400 may be preferred when multiple cylinders have an intermediate level of soot buildup. Methods 200 and 300 may be preferred when at least one cylinder has a higher level of soot buildup. Further, method 200 may be selected if there is a desire to report which cylinder is misfiring since the RMS values are calculated based on individual cylinder data before determining the maximum for the final values. Method 600 selects the method by which the engine misfire/spark plug fouling metric is to be determined and proceeds to 606. At 606, method 600 judges if the first method for determining the engine misfire/spark plug fouling metric has been selected. If so, the answer is yes and method 600 proceeds to 620. Otherwise, the answer is no and method 600 proceeds to 608.

At 608, method 600 judges if the second method for determining the engine misfire/spark plug fouling metric has been selected. If so, the answer is yes and method 600 proceeds to 610. Otherwise, the answer is no and method 600 proceeds to 630.

At 620, method 600 stores a normalized engine rate of engine speed change for each cylinder each engine cycle for a predetermined number of engine cycles (e.g., 50) to generate blocks of engine data as shown in FIG. 2. Method 600 may store normalized engine rate of engine speed change values during selected or particular engine speed/load ranges. In some examples, method 600 may require that the engine be operating at nearly steady state speed/load conditions before blocks of engine data may be generated. The engine data may be captured via an engine speed or position sensor and it may be stored in controller random access memory. The engine data stored in a block of engine data may be data that occurs in a predetermined number of engine cycles (e.g., 50). The number of engine cycles may be selected such that a block of data is not so large so as to overwhelm most recent engine data. Method 600 proceeds to 622.

At 622, method 600 determines a RMS value for each data block for each cylinder as shown in FIG. 2. Thus, if the engine is a six cylinder engine and six engine data blocks are generated for a predetermined number of engine cycles, method 600 generates six RMS values corresponding to one per cylinder. Method 600 proceeds to 624.

At 624, method 600 determines averages for a predetermined number of preceding RMS values for each cylinder as shown in FIG. 2. For example, method may average a present RMS value for cylinder number one with four prior most recent RMS values for cylinder number one to determine an average RMS value for cylinder number one. RMS values for each of the engine's other cylinders are averaged in a similar way. An average of five RMS values from five blocks where each block constitutes fifty values may provide a similar metric to computing a single RMS value from a single larger block that constitutes two hundred and fifty values, or an average of twenty five RMS values from twenty five smaller blocks where each block constitutes ten values (in all three cases, a total of two hundred and fifty values are used). A smaller number of blocks reduce the amount of data discarded at the end of a drive where a block with fewer than a requisite number of values is ignored. More memory is needed when a smaller number of blocks is used. An intermediate block size balances out memory usage and risk of discarding data. Method 600 proceeds to 626.

At 626, method 600 determines a maximum value from the averaged RMS values of each engine cylinder as shown in FIG. 2. For example, if the engine is a four cylinder engine, and if the average RMS value for cylinder number one is 0.6, the average RMS value for cylinder number two is 0.55, the average RMS value for cylinder number three is 0.66, and the average RMS value for cylinder number four is 0.58, method 600 selects 0.66 as the maximum average RMS value. Method 600 may also report out the cylinder with the largest RMS value as the misfiring cylinder or the cylinder with a fouled spark plug. Method 600 proceeds to 628.

At 628, method 600 sets the engine misfire/spark plug fouling metric to the value of the maximum average determined at 626. Method 600 performs the steps 620-628 to generate and process blocks of engine data for the predetermined number of engine cycles. Method 600 may begin generating new blocks of engine data once a block of engine data is complete as shown in FIG. 2. Steps 620-628 comprise method 200 of FIG. 2. Method 600 proceeds to 638.

At 638, method 600 judges if the value of the engine misfire/spark plug fouling metric is greater than a threshold value. The threshold value may not include units. The threshold value may be a function of engine speed, engine load, engine temperature, ambient temperature, and an amount of engine spark retard. If method 600 judges that the engine misfire/spark plug fouling metric is greater than the threshold value, the answer is yes and method 600 proceeds to 640. Otherwise, the answer is no and method 600 exits.

At 640, method 600 may request that a vehicle operator perform an engine clean out procedure via a human/machine interface. The procedure may include operating the engine at higher engine speeds and loads (e.g., greater than 2000 RPM and higher than 0.5 load) to remove deposits from the engine's spark plugs. In one example, the method may request that the engine be operated at a speed that is higher than a threshold engine speed (e.g., 2000 revolutions/minute) and at a higher engine load than a threshold engine load (e.g., 0.5 engine load, where engine load is a present engine air mass divided by a maximum theoretical engine air mass). Method 600 proceeds to 642.

At 642, method 600 may optionally adjust a transmission shifting schedule so that gears of the transmission may shift at higher vehicle speeds and driver demand torques than a baseline shifting schedule. For example, a baseline transmission gear shifting schedule may shift from first gear to second gear at 10 miles per hour and 0.2 or higher engine load. However, after method 600 requests an engine clean out be performed, the transmission may shift from first to second gear at 14 miles per hour and 0.3 or higher engine load. By adjusting the transmission shifting schedule, it may be possible to remove deposits from engine spark plugs with less effort. Method 600 proceeds to 644.

At 644, method 600 may optionally command an autonomous driver to perform an engine clean out by driving the vehicle over a route that may be provided by a navigation system. The travel route may allow the engine to reach higher speeds and loads so that deposits may be removed from engine spark plugs. The automatic driver causes the vehicle to travel over the requested travel route.

At 610, method 600 stores a normalized engine rate of engine speed change for each cylinder each engine cycle for a predetermined number of engine cycles (e.g., 50) to generate blocks of engine data as shown in FIG. 3. Method 600 may store normalized engine rate of engine speed change values during selected or particular engine speed/load ranges. In some examples, method 600 may require that the engine be operating at nearly steady state speed/load conditions before blocks of engine data may be generated. The engine data may be captured via an engine speed or position sensor and it may be stored in controller random access memory. The engine data stored in a block (e.g., a group of associated values) of engine data may be data that occurs in a predetermined number of engine cycles (e.g., 50). The number of engine cycles may be selected such that a block of data is not so large so as to overwhelm most recent engine data. Method 600 proceeds to 612.

At 612, method 600 determines a RMS value for each data block for each cylinder as shown in FIG. 3. Thus, if the engine is a six cylinder engine and six engine data blocks are generated for a predetermined number of engine cycles, method 600 generates six RMS values corresponding to one per cylinder. Method 600 proceeds to 614.

At 614, method 600 determines a maximum value from the RMS values of all engine cylinder during common engine cycles as shown in FIG. 3. For example, if the engine is a four cylinder engine, and if the RMS value for block 1 cylinder number one is 0.3, the RMS value for block 1 of cylinder number two is 0.45, the RMS value for block 1 of cylinder number three is 0.5, and the RMS value for block 1 of cylinder number four is 0.33, method 600 selects 0.5 as the maximum RMS value for the RMS values of common cylinder cycle data blocks. Method 600 proceeds to 616.

At 616, method 600 determines averages for a predetermined number of preceding maximum RMS values for common cylinder cycles as shown in FIG. 3. For example, method may average a present maximum RMS value for engine data taken during a most recent seventh group of common engine cycles along with four prior most recent maximum RMS values for the third through sixth groups of common engine cycles to determine an average maximum RMS value of all engine cylinders during the third through seventh engine cycles where engine data was collected. Method 600 proceeds to 618.

At 618, method 600 sets the engine misfire/spark plug fouling metric to the value of the average maximum RMS value determined at 616. Method 600 performs the steps 610-618 to generate and process blocks of engine data for the predetermined number of engine cycles. Method 600 may begin generating new blocks of engine data once a block of engine data is complete as shown in FIG. 3. Steps 610-618 comprise method 300 of FIG. 3. Method 600 proceeds to 638.

At 630, method 600 stores a normalized engine rate of engine speed change for each cylinder each engine cycle for a predetermined number of engine cycles (e.g., 50) to generate blocks of engine data as shown in FIG. 4. Method 600 may store normalized engine rate of engine speed change values during selected or particular engine speed/load ranges. In some examples, method 600 may require that the engine be operating at nearly steady state speed/load conditions before blocks of engine data may be generated. The engine data may be captured via an engine speed or position sensor and it may be stored in controller random access memory. The engine data stored in a block of engine data may be data that occurs in a predetermined number of engine cycles (e.g., 50). The number of engine cycles may be selected such that a block of data is not so large so as to overwhelm most recent engine data. Method 600 proceeds to 632.

At 632, method 600 determines an RMS value for all cylinders for common or same cylinder cycles as shown in FIG. 4. For example, an RMS value from engine data in blocks of engine data for all cylinders of an engine, all the blocks being generated in common engine cycles, is determined as indicated at rectangle 436 of FIG. 4. Thus, the RMS value is determined from unfiltered engine data associated with all of the engine's cylinders during a common group of engine cycles as indicated at 499. Method 600 proceeds to 634.

At 634, method 600 determines average values from two or more RMS values. In one example, a first average of RMS values may be calculated after the fifth RMS value is determined as shown in FIG. 4. The next average RMS value may be determined from the previous four RMS values and a newest RMS value. Thus, an averaging window of five RMS values may slide with the newest RMS value as shown in FIG. 4. A new average RMS value may be generated each time a new group of engine data blocks is generated as shown in FIG. 4. Method 600 proceeds to 636.

At 636, method 600 sets the engine misfire/spark plug fouling metric to the value of the new average RMS value determined at 634. Method 600 performs the steps 630-634 to generate and process blocks of engine data for the predetermined number of engine cycles. Method 600 may begin generating new blocks of engine data once a block of engine data is complete as shown in FIG. 4. Steps 630-634 comprise method 400 of FIG. 4. Method 600 proceeds to 638.

In this way, method 600 may determine an engine misfire/spark plug fouling metric via one of three ways depending of vehicle operating conditions and selections made during vehicle manufacturing. One of the three methods may be selected to meet vehicle performance and functionality attributes. For example, the third method may be selected to reduce a computational load that the methods may place on a controller. The three methods may improve detection of spark plug fouling and engine misfires. In addition, the approach may reduce the possibility of generating false positive engine misfire indications.

Thus, the method of FIG. 6 provides for a method for operating an engine, comprising: generating a group of average values comprising an average value for each cylinder of the engine, the average value for each cylinder of the engine generated via averaging a group of consecutively generated root mean square values; generating a maximum value from the group of average values; and adjusting operation of the engine in response to the maximum value. In a first example, the method includes where adjusting operation of the engine includes operating the engine above a threshold speed. In a second example that may include the first example, the method includes where the consecutively generated root mean square values are generated from blocks of engine measurements associated with a particular cylinder. In a third example that may include one or both of the first and second example, the method further comprises adjusting a shift schedule of a transmission in response to the maximum value exceeding a threshold value. In a fourth example that may include one or more of the first through third examples, the method further comprises driving a vehicle that includes the engine via an autonomous driver in response to the maximum value exceeding the threshold value. In a fifth example that may include one or more of the first through fourth examples, the method includes where the autonomous driver drives the vehicle over a route that is provided via a navigation system. In a sixth example that may include one or more of the first through fifth examples, the method includes where adjusting operation of the engine in response to the maximum value includes comparing the maximum value to a threshold value. In a seventh example that may include one or more of the first through sixth examples, the method includes where the threshold value is a function of engine speed and engine load. In an eighth example that may include one or more of the first through seventh examples, the method includes where the threshold value is a further function of an amount of spark retard and a fraction of direct injection fuel.

The method of FIG. 6 also provides for a method for operating an engine, comprising: generating a group of engine data blocks; generating a root mean square value from the group of engine data blocks; generating an average value from a group of root mean square values that includes the root mean square value; and adjusting operation of the engine in response to the average value. In a first example, the method includes where the group of engine data blocks include an engine data block for each engine cylinder. In a second example that may include the first example, the method includes where adjusting operation of the engine includes increasing engine speed and torque. In a third method that may include one or both of the first and second examples, the method further comprises comparing the average value to a threshold average value. In a fourth example that may include one or more of the first through third examples, the method includes where the group of engine data blocks includes a rate of engine speed change during an expansion stroke of an engine cylinder.

Note that the example control and estimation routines included herein can be used with various engine and/or vehicle system configurations. The control methods and routines disclosed herein may be stored as executable instructions in non-transitory memory and may be carried out by the control system including the controller in combination with the various sensors, actuators, and other engine hardware. The specific routines described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the example examples described herein, but is provided for ease of illustration and description. One or more of the illustrated actions, operations and/or functions may be repeatedly performed depending on the particular strategy being used. Further, the described actions, operations and/or functions may graphically represent code to be programmed into non-transitory memory of the computer readable storage medium in the engine control system, where the described actions are carried out by executing the instructions in a system including the various engine hardware components in combination with the electronic controller.

It will be appreciated that the configurations and routines disclosed herein are exemplary in nature, and that these specific examples are not to be considered in a limiting sense, because numerous variations are possible. For example, the above technology can be applied to V-6, I-4, I-6, V-12, opposed 4, and other engine types. The subject matter of the present disclosure includes all novel and non-obvious combinations and sub-combinations of the various systems and configurations, and other features, functions, and/or properties disclosed herein.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method for operating an engine, comprising:
generating a group of average values comprising an average value for each cylinder of the engine, the average value for each cylinder of the engine generated via averaging a group of consecutively generated root mean square values;
generating a maximum value from the group of average values;
adjusting operation of the engine in response to the maximum value; and
adjusting a shift schedule of a transmission in response to the maximum value exceeding a threshold value.

2. The method of claim 1, where adjusting operation of the engine includes operating the engine above a threshold speed.

3. The method of claim 1, where the consecutively generated root mean square values are generated from blocks of engine measurements associated with a particular cylinder.

4. The method of claim 1, further comprising driving a vehicle that includes the engine via an autonomous driver in response to the maximum value exceeding a threshold value.

5. The method of claim 4, where the autonomous driver drives the vehicle over a route that is provided via a navigation system.

6. The method of claim 1, where adjusting operation of the engine in response to the maximum value includes comparing the maximum value to a threshold value.

7. The method of claim 6, where the threshold value is a function of engine speed, engine load, engine temperature, and ambient temperature.

8. The method of claim 7, where the threshold value is a further function of an amount of spark retard and a fraction of directly injected fuel.

9. A system for operating an engine, comprising:
an internal combustion engine; and
a controller including executable instructions stored in non-transitory memory that cause the controller to generating a group of root mean square values comprising a root mean square value for each cylinder of the engine, generating a maximum value from the group of root mean square values; and to adjust operation of the internal combustion engine in response to an average value determined from a group of maximum values that includes the maximum value, where adjusting operation of the internal combustion engine includes increasing engine speed.

10. The system of claim 9, further comprising additional instructions to generate the average value by averaging values in the group of maximum values.

11. The system of claim 9, further comprising:
a torque actuator; and
additional instructions to adjust the torque actuator to adjust operation of the internal combustion engine.

12. The system of claim 11, where the torque actuator is a throttle.

13. The system of claim 9, further comprising additional instructions to generate root mean square values to include in the group of root mean square values.

14. The system of claim 13, where the root mean square values are determined from blocks of engine data.

15. A method for operating an engine, comprising:
generating a group of engine data blocks;
generating a root mean square value from the group of engine data blocks;
generating an average value from a group of root mean square values that includes the root mean square value; and
adjusting operation of the engine in response to the average value, where adjusting operation of the engine includes increasing engine load.

16. The method of claim 15, where the group of engine data blocks include an engine data block for each engine cylinder.

17. The method of claim 16, where adjusting operation of the engine includes increasing engine speed and torque.

18. The method of claim 15, further comprising comparing the average value to a threshold average value.

19. The method of claim 15, where the group of engine data blocks includes a rate of engine speed change during an expansion stroke of an engine cylinder.

* * * * *